United States Patent [19]

Hong et al.

[11] Patent Number: 5,529,942

[45] Date of Patent: Jun. 25, 1996

[54] SELF-ALIGNED CODING PROCESS FOR MASK ROM

[75] Inventors: Gary Hong; Chen-Chiu Hsue, both of Hsinchu, Taiwan

[73] Assignee: United Microelectronics Corp., Hsinchu, Taiwan

[21] Appl. No.: 264,738

[22] Filed: Jun. 23, 1994

[51] Int. Cl.$^6$ ............................................... H01L 21/266
[52] U.S. Cl. ........................ 437/45; 437/48; 437/984
[58] Field of Search .......................... 437/45, 48, 147, 437/148, 984

[56] References Cited

U.S. PATENT DOCUMENTS

| | | | |
|---|---|---|---|
| 4,513,494 | 4/1985 | Batra | 437/48 |
| 5,081,052 | 1/1992 | Kobayashi et al. | 437/45 |
| 5,278,078 | 1/1994 | Kanebako et al. | 437/45 |
| 5,429,967 | 7/1995 | Hong | 437/48 |

*Primary Examiner*—Chandra Chaudhari
*Attorney, Agent, or Firm*—Ladas & Parry

[57] ABSTRACT

A ROM coding method with a self-aligned implantation. First, a non-coded mask ROM with a semiconductor substrate, a plurality of bit-lines formed on the semiconductor substrate, a gate oxide formed over the semiconductor substrate and the bit-line, and a plurality of word-lines formed above the gate oxide, which together form memory cells, is provided. Before the word-lines are formed, a barrier material is applied over spacing strips between the locations where the word-lines are to be formed. The barrier material serves as a mask through which impurities are implanted into the substrate to selectively program the memory cells to operate in either a first or second conduction state.

16 Claims, 5 Drawing Sheets

SELF-ALIGNED CODING PROCESS FOR MASK ROM

BACKGROUND OF THE INVENTION

1. Field of the Invention

The present invention relates generally to a mask ROM coding process with a self-aligned implantation mask ROM, and more particularly, to a method of using a barrier material spaced between the expected word-lines as a self-aligning mask to resolve the problem of side-diffusion which occurs during the subsequent impurity implantation process.

2. Description of the Prior Art

FIG. 1 shows a plan view of a prior art mask ROM. FIG. 2 shows a cross-sectional view of the prior art mask ROM along the line II—II of FIG. 1. FIG. 3 shows a cross-sectional view of the prior art mask ROM along the line III—III of FIG. 1. As is best illustrated in FIG. 2, the prior art mask ROM comprises: a P-type semiconductor substrate 10; a plurality of $N^+$ type bit-lines 12 formed on the P-type semiconductor substrate 10 by the implantation of impurities thereinto; a gate oxide layer 14 formed on the surface of the P-type semiconductor substrate 10 and the bit-lines 12; and a plurality of word-lines 16 formed on the gate oxide layer 14, which together form an array of memory cells.

The prior art technique for programming a memory cell of mask ROM 1 involves implanting an impurity 18 which prevents conduction between the two adjacent bit lines 12. This programming technique first involves forming a photoresist layer 20 over the substrate 10. Next, conventional photolithography and etching techniques are used to form an opening 22. Thereafter, boron ions are implanted into the substrate 10 through the opening 22 to form a P type region 18 which is doped so heavily that conduction is cut off even when an electrical potential is applied to the overlying word-line 16.

However, the foregoing prior art method has a drawback in that it is difficult to align the opening 22 accurately on the photoresist 20. If the opening is improperly positioned on the photoresist 20, that causes a side-diffusion effect which is problematic because it can affect the conduction state of adjacent memory cells. For example, a supposedly conducting memory cell can become non-conducting and vice versa due to this side-diffusion effect.

SUMMARY OF THE INVENTION

A principal object of the present invention is to provide an effective and easily implemented method for coding the memory cells of a mask ROM.

Another object of the present invention is to provide a self-aligned coding procedure for a mask ROM that resolves the aforementioned problem of ROM coding misalignment and the side-diffusion of doped impurities caused thereby.

In accordance with the objects of the present invention, a method of self-aligned coding for a mask ROM is disclosed. Impurities are implanted to set memory cells of the mask ROM to a first conduction state or a second conduction state, wherein the mask ROM comprises: a substrate, a plurality of bit-lines formed in the substrate, a gate oxide layer formed on the bit-lines and the substrate, and a plurality of word-lines formed on the gate oxide layer, which together form an array of memory cells.

According to the method of the present invention, a barrier material is applied over spacing strips between the locations where the word-lines are to be formed before the word-lines are formed. The barrier material is used as a mask for implanting impurities into the substrate so as to program selected memory cells to operate in a first conduction state and other memory cells to operate in a second conduction state.

The method further comprises the procedures of forming word-lines between the spacing strips. More specifically, a gate oxide is formed on the substrate between the barrier strips, a polysilicon layer is then deposited and patterned to form the word-lines, and the barrier material is removed.

The disclosed method provides a self-aligned implantation for photo-masked ROM coding, wherein the barrier material strips are positioned between the word-lines so that the openings of the photoresist layer can be used as a self-aligning mask; and, therefore, the problem of impurity side diffusion during coding is alleviated without having to revise or add additional photo-masks.

BRIEF DESCRIPTION OF DRAWINGS

The present invention can be more fully understood by referring to the following description and accompanying drawings, which form the integral part of this application.

DESCRIPTION OF PREFERRED EMBODIMENT

Figure 1:
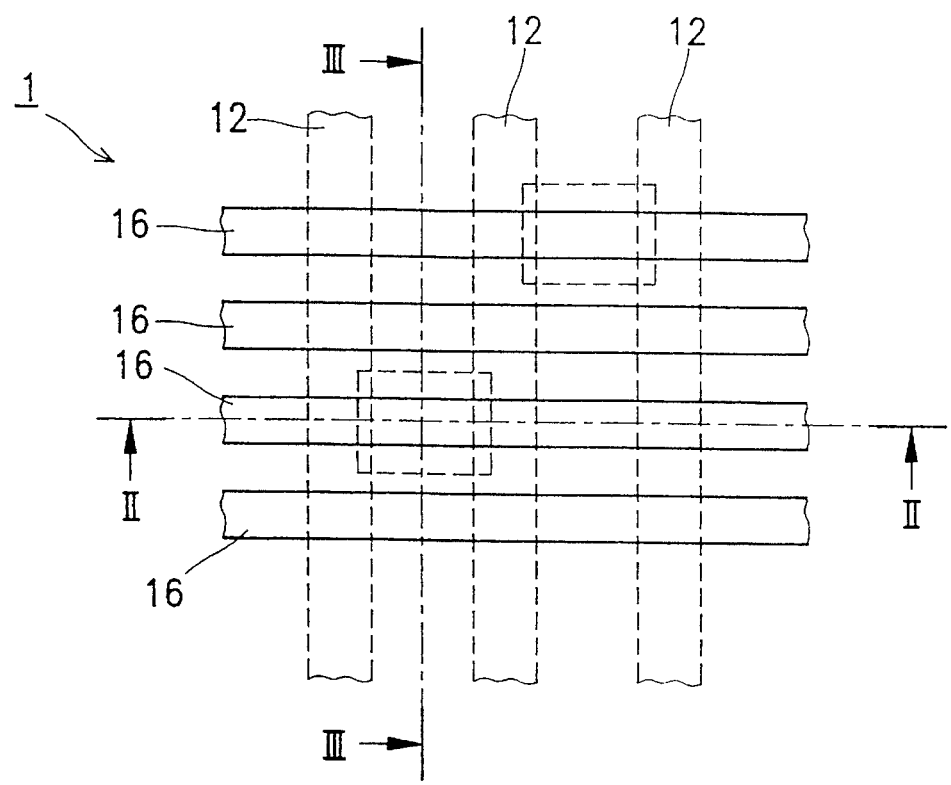
FIG. 1 is a plan view of a prior art mask ROM.
Figure 2:
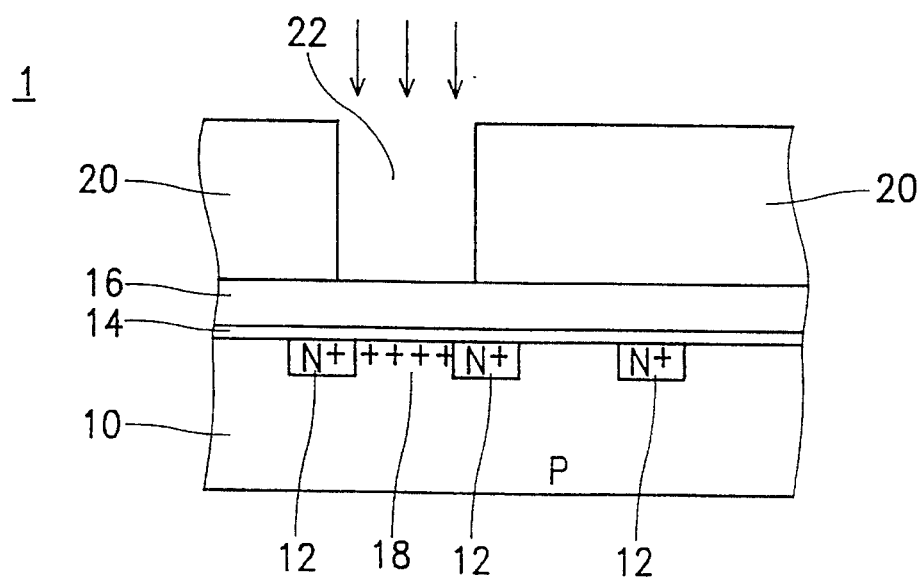
FIG. 2 is a cross-sectional view of the prior art mask ROM of FIG. 1 along the II—II line.
Figure 3:
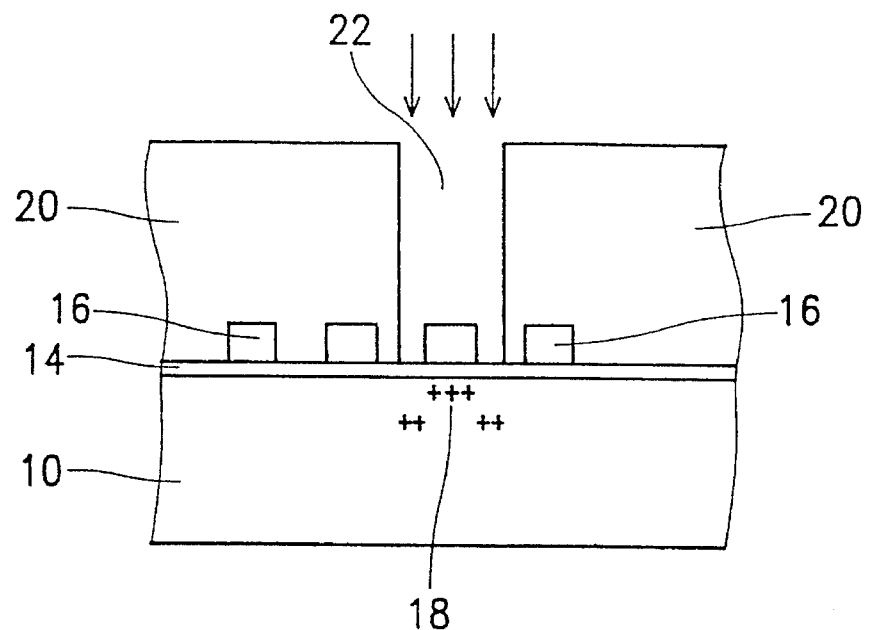
FIG. 3 is a cross-sectional view of the prior art mask ROM of FIG. 1 along the III—III line.
Figure 4:
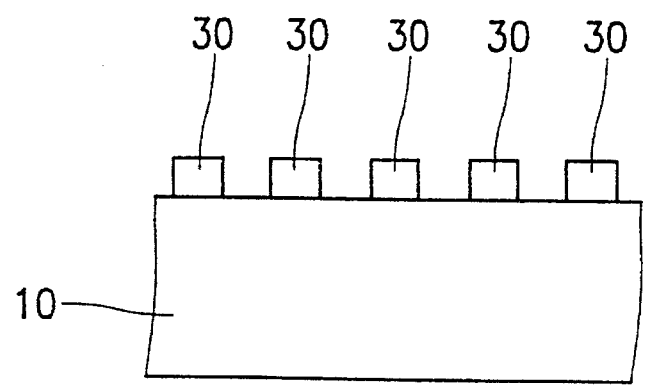
FIG. 4 to FIG. 9 schematically illustrate in cross-sectional representation one preferred embodiment according to the present invention.

FIGS. 4 to 9 are cross-sectional illustrations of the mask ROM 1 during various stages of the coding process of this invention. The self-aligned implantation method of the present invention is suitable for coding the mask ROM 1 as shown in FIGS. 1 and 3. The disclosure hereinafter provided designates mask ROM parts embodying the method of the present invention with reference numerals similar to those of the prior art mask ROM to avoid repetition. The mask ROM 1 fabricated in accordance with the method of the present invention includes: a substrate 10 (N-type or P-type), a plurality of bit-lines 12 (not shown in FIGS. 4 to 9, but they are configured as is shown in FIGS. 1 and 2) formed in the substrate 10, a gate oxide 14 formed above the bit-lines 12, and a plurality word-lines 16 formed on the gate oxide 14 which together form the memory cells. The self-aligned mask ROM coding method of the present invention includes the following steps:

Step 1:

Refer first to FIG. 4. Before the word-lines 16 are formed, barrier strips 30 are formed over the substrate 10 and positioned in between the expected positions of the word-lines 16. The barrier strips 30 may, for example, be formed by depositing nitride (or oxide) with a barrier strip thickness of approximately 2000–5000 Å, and then using conventional photolithography and etching techniques to form the barrier strips 30 between the locations where the word-lines 16 are expected to be formed.

Figure 5:
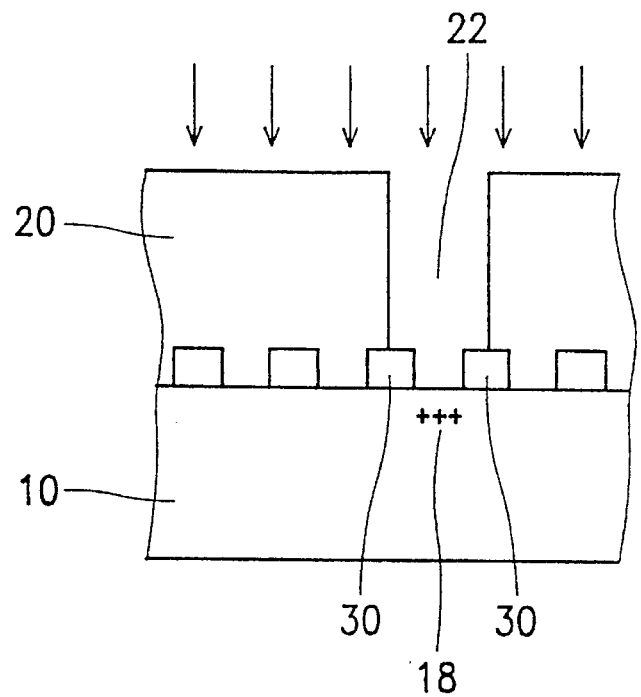

Step 2:

As is shown in FIG. 5, a photoresist layer 20 is deposited over the substrate the substrate 10 and over the barrier strips 30. To program the ROM, it is patterned to form openings 22 through which impurities are implanted to program the memory cells therebeneath. For example, boron ions may be implanted through the opening 22 shown in FIG. 5 to form a heavily doped region 18, thereby programming the underlying memory cell to be non-conducting, while the remaining cells are left undoped and thus conducting. Hence, the barrier material 30 is automatically aligned as a mask, thereby enabling the doped region 18 to be formed directly beneath the locations where the word-lines 16 are expected to be formed. The barrier material 30 is sufficiently thick to block all implantation. Hence, only the area of silicon substrate 10 not covered by the photoresist mask 20 or the barrier layer 30 is implanted with impurities. The photoresist layer 20 is thereafter removed.

Figure 6:
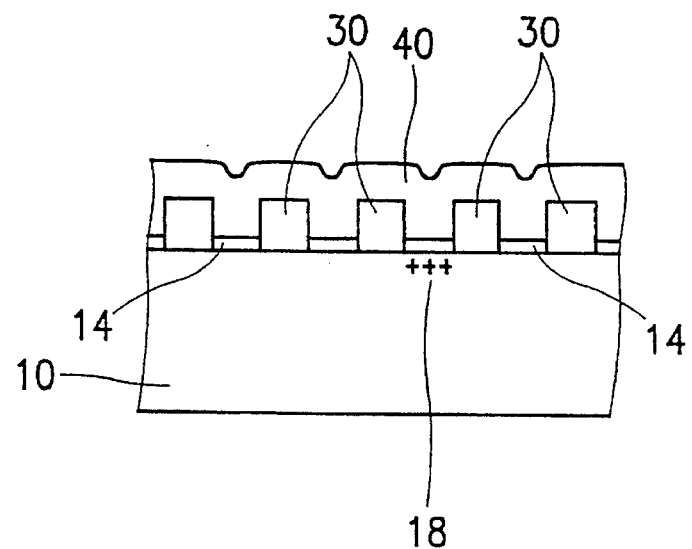

Step 3:

According to the present invention and as illustrated in FIGS. 6, a gate oxide layer 14 with a gate oxide layer thickness of approximately 80–200 Å is next formed over the substrate 10 and between the barrier materials 30. Then, a polysilicon layer 40 with a polysilicon layer thickness of approximately 3000–8000 Å is deposited over the gate oxide layer 14 and over the barrier materials 30, after which impurities of N-type are implanted into the polysilicon layer 40 to improve conduction.

Figure 7:
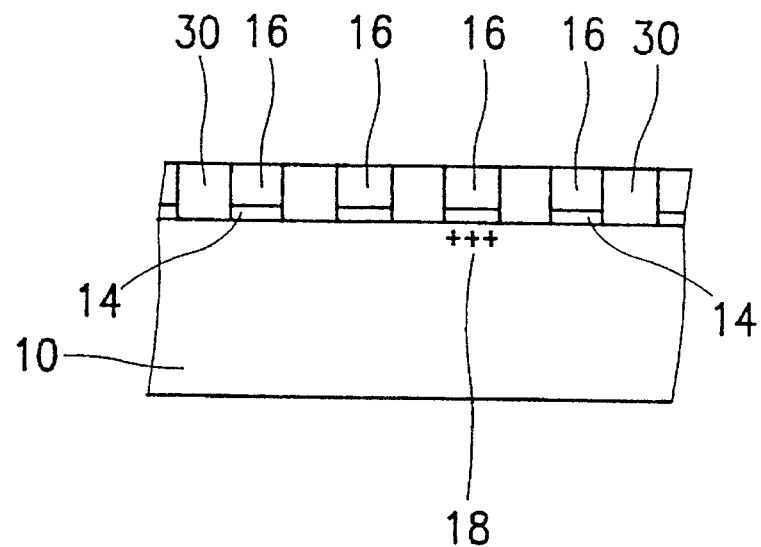

Step 4:

As shown in FIG. 7, a chemical-mechanical polishing (CMP) process or an etching process is next utilized to expose the barrier material 30. The polysilicon layer 40 is polished or etched flush with the barrier material 30 to form the word-lines 16.

Figure 8:
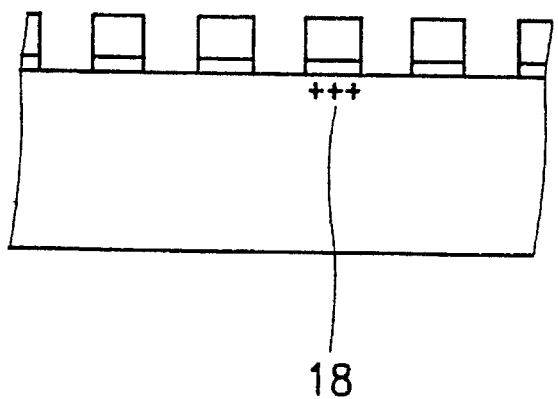

Step 5:

FIG. 8 shows that a wet etchant such as phosphoric acid is next used to remove the barrier material 30 from between the word-lines 16. However, this is an optional step. The barrier material 30 can be left as it is since the barrier material 30 (nitride or oxide) is an insulator.

Figure 9:
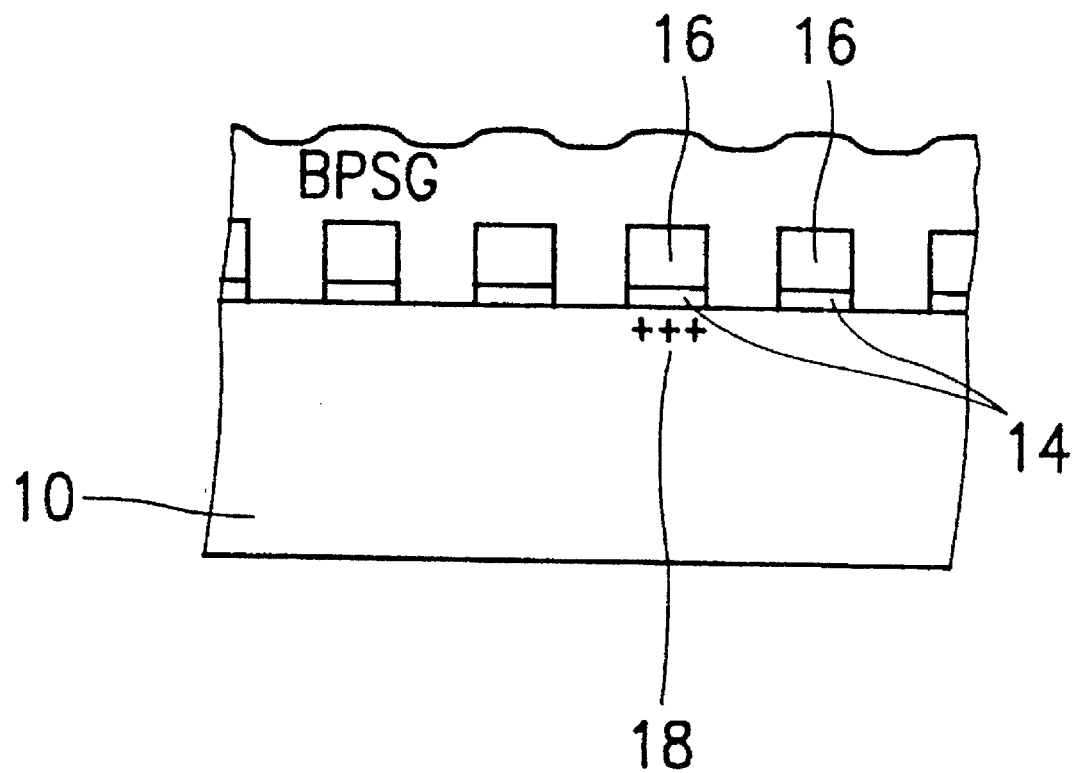

Step 6:

As is shown in FIG. 9, borophosphosilicate glass (BPSG) or borophosphotetraethylorthosilicate (BPTEOS) with a thickness of approximately 5000–9000 Å is deposited over the implanted region, and then a metallization procedure is performed. The above-described procedures of this step are conventional and, therefore, are not further discussed.

In summary, the disclosed invention provides a method of self-aligned mask ROM coding by which is realized by forming barrier materials between word-lines, thereby enabling the openings of the photoresist layer to self-align. As a result, the effect of "side diffusion" during the impurity implantation for ROM coding is eliminated without requiring modifications to existing photo-masks or the use of additional masks.

Although preferred embodiments for this invention are described above, the disclosed invention is not limited to such embodiments. On the contrary, for anyone skilled in the arts, it is intended to cover various modifications and similar arrangements included within the spirit and scope of the appended claims, the scope of which should be accorded the broadest interpretation so as to encompass all such modifications and similar structures.

What is claimed is:

1. An improved mask ROM programming method for self-aligned coding of memory cells of said mask ROM to operate in a first state or a second state, said method including forming a plurality of bit-lines on a semiconductor substrate of said mask ROM, forming a gate oxide over said semiconductor substrate and said bit-lines and forming a plurality of word-lines above said gate oxide to form said memory, the improvement comprising:

on said substrate, applying barrier materials over spacing strips between locations where said word-lines are to be formed before said word-lines are formed; and implanting impurities into said substrate through said barrier materials to program selected said memory cells to operate in said first state and other said memory cells to operate in said second state.

2. The method of claim 1 further comprising forming said word-lines between said barrier materials.

3. The method of claim 2 further comprising forming a gate oxide layer in between said barrier materials, and forming said word-lines from polysilicon above said gate oxide.

4. The method of claim 3 further comprising removing said barrier materials.

5. The method of claim 4 wherein said barrier materials are made of nitride.

6. The method of claim 4 wherein said barrier materials are made of oxide.

7. The method of claim 1, wherein said first state is a non-conducting state and said second state is a conducting state.

8. The method of claims 1 wherein said first state is a conducting state and said second state is a non-conducting state.

9. A ROM coding process with a self-aligned implantation, comprising the steps of:

(a) providing a semiconductor substrate with a plurality of bit-lines formed therein, said substrate further including word-line locations thereon where a plurality of word-lines are to be formed;

(b) forming a plurality of barrier strips on said substrate over spacing strips between said word-line locations;

(c) depositing a photoresist layer over said substrate and over said barrier strips;

(d) patterning said photoresist layer to form openings over selected memory cells of said ROM;

(e) programming said selected memory cells by implanting impurities into said substrate through said openings;

(f) removing said photoresist layer;

(g) forming a gate oxide layer over said substrate and between said barrier strips; and (h) forming a polysilicon gate layer over said gate oxide layer and between said barrier strips.

10. The ROM coding process of claim 9, wherein said barrier strips of said step (b) are formed by depositing nitride.

11. The ROM coding process of claim 9, wherein said barrier strips of said step (b) are formed by depositing oxide.

12. The ROM coding process of claim 9, wherein said barrier strips of said step (b) are formed with a barrier strip thickness of approximately 2,000 Å–5,000 Å.

13. The ROM coding process of claim 9, wherein said selected memory cells of said step (e) are programmed by implanting Boron ions into said substrate through said openings.

14. The ROM coding process of claim 9, wherein said gate oxide layer of said step (g) is formed with a gate oxide layer thickness of approximately 80 Å–200 Å.

15. The ROM coding process of claim 9, wherein said polysilicon gate layer of said step (h) is deposited with a polysilicon layer thickness of approximately 3,000 Å–8,000 Å.

16. The ROM coding process of claim 9 further comprising step (i) removing said barrier strips.

\* \* \* \* \*